United States Patent
Lu et al.

(10) Patent No.: US 11,519,846 B2
(45) Date of Patent: Dec. 6, 2022

(54) STRUCTURE AND METHOD TO USE ACTIVE SURFACE OF A SENSOR

(71) Applicant: ILLUMINA, INC., San Diego, CA (US)

(72) Inventors: Donglai Lu, San Diego, CA (US); Xiuyu Cai, San Diego, CA (US); Wenyi Feng, San Diego, CA (US); Hai Tran, San Diego, CA (US)

(73) Assignee: ILLUMINA, INC., San Diego, CA (US)

( * ) Notice: Subject to any disclaimer, the term of this patent is extended or adjusted under 35 U.S.C. 154(b) by 94 days.

(21) Appl. No.: 16/626,126

(22) PCT Filed: Jan. 29, 2019

(86) PCT No.: PCT/US2019/015690
§ 371 (c)(1),
(2) Date: Dec. 23, 2019

(87) PCT Pub. No.: WO2019/152425
PCT Pub. Date: Aug. 8, 2019

(65) Prior Publication Data
US 2020/0124523 A1    Apr. 23, 2020

Related U.S. Application Data

(60) Provisional application No. 62/626,021, filed on Feb. 3, 2018.

(51) Int. Cl.
*G01N 21/05* (2006.01)
*G01N 21/17* (2006.01)
(Continued)

(52) U.S. Cl.
CPC ............. *G01N 21/05* (2013.01); *B01L 3/508* (2013.01); *B01L 2200/12* (2013.01);
(Continued)

(58) Field of Classification Search
CPC ............. G01N 21/05; G01N 21/6454; G01N 2021/6482; G01N 21/17; G01N 21/645;
(Continued)

(56) References Cited

U.S. PATENT DOCUMENTS 4,708,765 A   11/1987  Newman
7,332,902 B1  2/2008   Vermeire et al.
(Continued)

FOREIGN PATENT DOCUMENTS

CN   102713720 A   10/2012
CN   103348215 A   10/2013
(Continued)

OTHER PUBLICATIONS

Datta-Chaudhuri et al., "Packaging commercial CMOS chips for lab on a chip integration," Lab on a Chip, Royal Society of Chemistry, 14(10):1753-1766 (2014).
(Continued)

*Primary Examiner* — Matthew D Krcha
*Assistant Examiner* — Sophia Y Lyle
(74) *Attorney, Agent, or Firm* — Marshall, Gerstein & Borun LLP

(57) ABSTRACT

Disclosed is an apparatus and method of forming, including a supporting structure, a sensor on the supporting structure, a pair of columns on the supporting structure at opposite sides of the sensor, the pair of columns having a column height relative to a top surface of the supporting structure, the column height being higher than a height of the active surface of the sensor relative to the top surface of the supporting structure, and a lidding layer on the pair of columns and over the active surface, the lidding layer being supported at opposite ends by the pair of columns. The active surface of the sensor, the lidding layer and the pair of columns form an opening above at least more than about half (Continued)

of the active surface of the sensor, and the supporting structure, the sensor, the lidding layer and the pair of columns together form a flow cell.

21 Claims, 3 Drawing Sheets

(51) Int. Cl.
    *B01L 3/00*     (2006.01)
    *H01L 27/146*     (2006.01)

(52) U.S. Cl.
    CPC ... *B01L 2300/0627* (2013.01); *B01L 2300/12* (2013.01); *H01L 27/14643* (2013.01)

(58) Field of Classification Search
    CPC ............. G01N 2021/1765; B01L 3/508; B01L 2200/12; B01L 2300/0627; B01L 2300/12; B01L 2300/0663; B01L 2300/0877; B01L 2300/0887; B01L 3/502715; H01L 27/14643
    See application file for complete search history.

(56) References Cited

U.S. PATENT DOCUMENTS

| | | | |
|---|---|---|---|
| 7,751,048 | B2 | 7/2010 | Yang et al. |
| 8,906,320 | B1 | 12/2014 | Eltoukhy et al. |
| 9,624,536 | B2 | 4/2017 | Peumans |
| 2002/0086293 | A1 | 7/2002 | Noolandi et al. |
| 2006/0262303 | A1 | 11/2006 | Bonne et al. |
| 2008/0219615 | A1 | 9/2008 | Cunningham |
| 2012/0194669 | A1* | 8/2012 | Hutto ................. G01N 21/6458 348/135 |
| 2013/0307954 | A1 | 11/2013 | Vaartstra |
| 2014/0273188 | A1* | 9/2014 | Mohan ................... G02B 21/00 435/287.2 |
| 2014/0353789 | A1 | 12/2014 | Oganesian et al. |
| 2015/0002834 | A1 | 1/2015 | Fine et al. |
| 2015/0079596 | A1* | 3/2015 | Eltoukhy ........... G01N 21/6486 435/6.12 |
| 2015/0138648 | A1 | 5/2015 | Lee et al. |
| 2015/0168362 | A1* | 6/2015 | Lin .................. B01L 3/502715 73/31.06 |
| 2016/0041094 | A1 | 2/2016 | Lei |
| 2017/0322402 | A1* | 11/2017 | Fine .................. G02B 21/0008 |
| 2018/0327832 | A1* | 11/2018 | Ramirez ........... B01L 3/502707 |

FOREIGN PATENT DOCUMENTS

| | | |
|---|---|---|
| CN | 105372244 A | 3/2016 |
| CN | 105548096 A | 5/2016 |
| CN | 105765440 A | 7/2016 |
| EP | 2 124 039 A1 | 11/2009 |
| TW | I533929 | 5/2016 |
| WO | WO-2015/138648 A1 | 9/2015 |

OTHER PUBLICATIONS

Lindsay et al., "Scalable hybrid integration of CMOS circuits and fluidic networks for biosensor applications," IEEE Biomedical Circuits and Systems Conference, pp. 1-4 (2017).

Laplatine et al., "System-level integration of active silicon photonic biosensors," Process in Biomedical Optics and Imaging, SPIE—International Society for Optical Engineering (2017).

* cited by examiner

STRUCTURE AND METHOD TO USE ACTIVE SURFACE OF A SENSOR

CROSS-REFERENCE TO RELATED APPLICATIONS

This application is a 35 U.S.C. § 371 National Stage of International Patent Application No. PCT/US2019/015690, filed Jan. 29, 2019, which itself claims the benefit of and priority to U.S. Provisional Patent Application No. 62/626,021, filed Feb. 3, 2018, the content of each of which is incorporated by reference herein in its entirety and for all purposes.

BACKGROUND

Currently, lids of flow cells used with a sensor for on-chip detection are supported above the active surface of the sensor by columns situated on the active surface. The reason for putting the lid over the sensor is the flatness and smoothness of active area (submicron roughness) often needed to enable fluidic exchange to happen cleanly without entrainment or trapping of reagents. The current structure leads to a reduction in the area of the active surface that can be used for sensing. In some cases, only one-third (or less) of the active surface of the sensor is able to be used.

Therefore, there is a need for a way to use more of the active surface of a sensor.

SUMMARY

The shortcomings of pre-existing approaches may be overcome and additional advantages are provided through the provision, in one aspect, of an apparatus. The apparatus comprises a supporting structure, a sensor on the supporting structure, the sensor comprising an active surface, a pair of columns, each column situated on the supporting structure at opposite sides of the sensor, each of the pair of columns comprising a column height relative to a top surface of the supporting structure, the column height being higher than a height of the active surface of the sensor relative to the top surface of the supporting structure. The apparatus also includes a lidding layer on the pair of columns and over the active surface of the sensor, the lidding layer being supported at opposite ends thereof by the pair of columns. The active surface of the sensor, the lidding layer and the pair of columns form an opening above at least more than about half of the active surface of the sensor, and the supporting structure, the sensor, the lidding layer and the pair of columns together form a flow cell.

In accordance with another aspect, a method is provided. The method comprises forming a flow cell, the forming comprising placing a sensor on a supporting structure, the sensor comprising an active surface, forming a pair of columns, each column at opposite sides of the sensor, each of the pair of columns comprising a column height relative to a top surface of the supporting structure, the column height being higher than a height of the active surface of the sensor relative to the top surface of the supporting structure, and placing a lidding layer on top surfaces of the pair of columns, such that the lidding layer and the pair of columns form a space above at least about half of the active surface of the sensor.

BRIEF DESCRIPTION OF THE DRAWINGS

These, and other objects, features and advantages of this disclosure will become apparent from the following detailed description of the various aspects thereof taken in conjunction with the accompanying drawings, in which:

FIG. 1 is a cross-sectional view of one example of a chip including a die with a sensor thereon, in accordance with one or more aspects of the present disclosure. The sensor includes, for example, an active surface.

FIG. 2 is a cross-sectional view of one example of prepping for and placing of the sensor and die of FIG. 1 onto a supporting structure, in accordance with one or more aspects of the present disclosure.

FIG. 3 is a cross-sectional view of one example of forming bottom column portions adjacent either side of the die of FIG. 2, in accordance with one or more aspects of the present disclosure.

FIG. 4 is a cross-sectional view of one example of forming top column portions over the bottom column portions of FIG. 3, in accordance with one or more aspects of the present disclosure.

FIG. 5 is a cross-sectional view of one example of an end structure after placing a lidding layer on the top column portions, resulting in a space above at least about half (in this case, all or nearly all) of the active surface of the sensor, in accordance with one or more aspects of the present disclosure.

DETAILED DESCRIPTION

Figure 1:
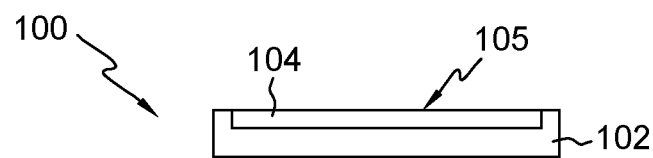
FIGS. 1-5 are cross-sectional views of one example of various stages of fabricating the apparatus disclosed in the present disclosure.

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the relevant details. It should be understood, however, that the detailed description and the specific examples, while indicating aspects of the disclosure, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that may permissibly vary without resulting in a change in the basic function to which it is related. Accordingly, a value modified by a term or terms, such as "about" or "substantially," is not limited to the precise value specified. In some instances, the approximating language may correspond to the precision of an instrument for measuring the value.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the approximating terms "about," "substantially" and the like, used with a value, such as measurement, size, etc., means a possible variation of plus or minus ten percent of the value.

As used herein, the terms "bond," "bonded" and "bonding" refer to two things being joined securely together using an adhesive or bonding agent together with a heat process or pressure. As used herein, the term "attach" refers to joining two things together, with or without the use of a fastener (e.g., screw, adhesive or bonding agent, etc.) Thus, the term "bond" is a subset of the term "attach."

Reference is made below to the drawings, which are not drawn to scale for ease of understanding, wherein the same reference numbers are used throughout different figures to designate the same or similar components.

The present disclosure provides examples related to apparatus allowing for use of an entire active surface of a sensor and a method of fabricating the apparatus.

FIGS. 1-5 are cross-sectional views of one example of various stages of fabricating the apparatus disclosed in the present disclosure. Although the present example includes planar sensor devices, it will be understood that non-planar devices may instead be used, or a combination thereof.

FIG. 1 is a cross-sectional view of one example of a chip 100 including a die 102 with sensor 104 thereon, in accordance with one or more aspects of the present disclosure. The sensor includes, for example, active surface 105. As used herein, the term "active surface" refers to a surface or surface portion of a sensor where sensing actively takes place. For example, the active surface of a digital image sensor is the surface including the photosites or pixels for sensing light. Non-limiting examples of the function(s) of the sensor include, for example, light sensing (e.g., having a predetermined range of wavelengths sensed), detecting the presence of one or more substances (e.g., biological or chemical substance) and detecting a change in concentration of something (e.g., ion concentration). The sensor may include, for example, one or more semiconductor materials, and may take the form of, for example, a Complementary Metal-Oxide Semiconductor (CMOS) sensor (e.g., a CMOS image sensor) or a Charge-Coupled Device (CCD), another type of image sensor. In the present example, a CMOS image sensor is used, but other types of sensors may be used. As one skilled in the art will know, the circuitry of a CMOS image sensor includes passive electronic elements, such as a clock and timing generation circuit, an analog-to-digital converter, etc., as well as an array of photodetectors to convert photons (light) to electrons, which is then converted to a voltage. Where semiconductor based, the sensor may be fabricated on a silicon substrate (e.g., a silicon wafer), which becomes the die when cut from the silicon wafer. The thickness of the die may depend on the size (diameter) of the silicon wafer. For example, a standard silicon wafer with a 51 mm diameter may have a thickness of about 275 microns, while a standard silicon wafer with a diameter of 300 mm may have a thickness of about 775 microns. As used herein, the active area of the sensor(s) refers to the sensor surface that will come into contact with the reagent(s) for sensing. There may be more than one sensor on the die, and different sensors may be included on the same die.

As one skilled in the art will understand, "CMOS" refers to a technology used to fabricate integrated circuits. As used herein, "CMOS sensor" and "CMOS image sensor" refer to sensors fabricated using CMOS technology. The "complementary" aspect of the name refers to the inclusion of both n-type and p-type metal-oxide semiconductor field effect transistors (MOSFETs) in integrated circuits (ICs) fabricated using CMOS technology. Each MOSFET has a metal gate with a gate dielectric, such as an oxide (hence, the "Metal-Oxide" part of the name) and a semiconductor material below the gate (corresponds to "Semiconductor" in the name). ICs are fabricated on a die, which is a portion of a semiconductor substrate or wafer that is cut out after fabrication, and ICs fabricated using CMOS technology are characterized by, for example, high noise immunity and low static power consumption (one of the transistors is always off).

In one example, a CMOS image sensor may include, for example, millions of photodetectors, also called pixels. Each pixel includes a photosensor, which accumulates charge from the light, an amplifier to convert the accumulated charge into a voltage, and a pixel-select switch. Each pixel may also include, for example, an individual microlens to capture more of the light, or have other enhancements to improve the image such as, for example, noise reduction.

One example of the fabrication of a semiconductor device fabricated using CMOS technology will now be provided. Starting, for example, with a p-type semiconductor substrate, the NMOS region may be protected while an n-type well is created in the PMOS region. This may be accomplished using, for example, one or more lithographic processes. A thin gate oxide and gate (e.g., polysilicon) may then be formed in both the NMOS and PMOS regions. N+ type dopant regions may be formed in the p-type substrate of the NMOS region on either side of the dummy gate (i.e., the source and drain are formed), and one region of the n+ type dopant as the body (here, the well) contact in the PMOS region. This may be accomplished using, for example, a mask. The same process of masking and doping may then be used to form the source and drain in the PMOS region and the body contact in the NMOS region. Metallization to form the terminals to the various regions of the NMOS and PMOS transistors (i.e., body, source, drain and gate) may then be performed. Unlike CCDs, CMOS image sensors may include other circuits on the same chip at little to no extra cost, providing functions such as image stabilization and image compression on-chip.

Figure 2:
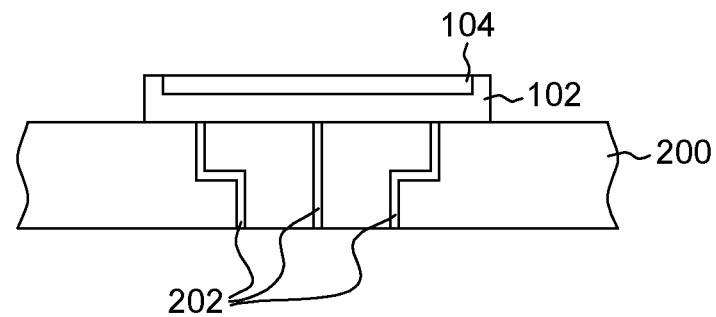

FIG. 2 is a cross-sectional view of one example of preparation for and placement of the die 102 and sensor 104 of FIG. 1 onto a supporting structure 200, in accordance with one or more aspects of the present disclosure. In one example, the supporting structure 200 may take the form of a dielectric layer with one or more conductive pathways 202 therethrough. In another example, the supporting structure may instead take the form of a dielectric layer alone. Non-limiting examples of dielectric materials that may be used in the dielectric layer include low-k dielectric materials (dielectric constant less than that of silicon dioxide, about 3.9), such as fluorine-doped silicon dioxide, carbon-doped silicon dioxide and porous silicon dioxide, and high-k dielectric materials (dielectric constant above about 3.9), such as silicon nitride (SiNx) and hafnium dioxide. The die may be attached to the supporting structure using, for example, a die-attach adhesive that may provide, for example, low or ultra-low stress on the sensor and high temperature stability.

Figure 3:
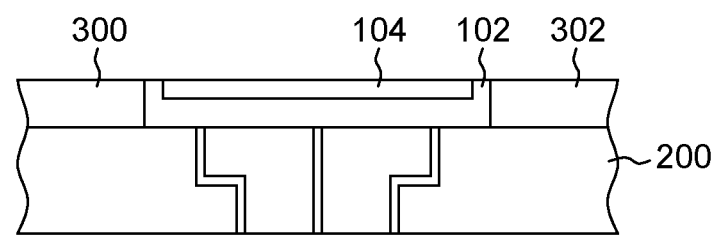

FIG. 3 is a cross-sectional view of one example of forming bottom column portions 300 and 302 adjacent either side of the die 102 of FIG. 2, in accordance with one or more aspects of the present disclosure. Non-limiting examples of the material of the bottom column portions include, for example, a filler material, such as an epoxy or a plastic molding compound (e.g., phenolic hardeners, silicas, catalysts, pigments and mold release agents). During the formation of the bottom column portions, the sensor may be protected with, for example, a removable film (e.g., silicon dioxide). Alternatively, the material of the bottom column portions may be conformally deposited, then planarized down to the sensor(s) or the bottom column portions may be formed, for example, using a direct deposition process. In one example of conformal deposition and planarization, the epoxy may be blanketly deposited over the structure, followed by a planarization process (e.g., chemical-mechanical polishing (CMP)).

Figure 4:
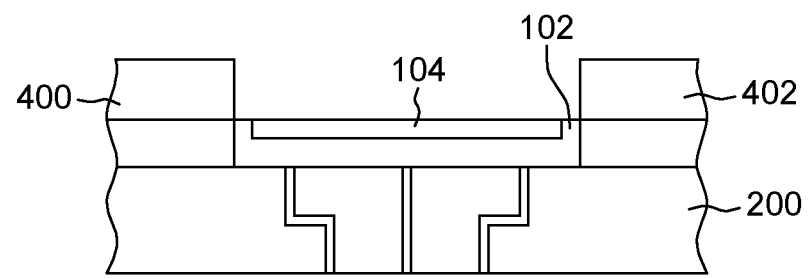

FIG. 4 is a cross-sectional view of one example of forming top column portions 400 and 402 over the bottom column portions 300 and 302 of FIG. 3, in accordance with one or more aspects of the present disclosure. Non-limiting examples of the material of the top column portions include, for example, a filler material, such as an epoxy or a plastic molding compound as described above with respect to the bottom column portions. During the formation of the top column portions, the sensor and die may be protected with, for example, an easily removable film (e.g., silicon dioxide) without damage to the sensor. Alternatively, the material of the top column portions may be conformally deposited, then planarized down to the sensor(s). Also, although the columns each had two portions in this example, it will be understood that the columns may each instead be one continuous column or the columns may instead have more than two portions.

Figure 5:
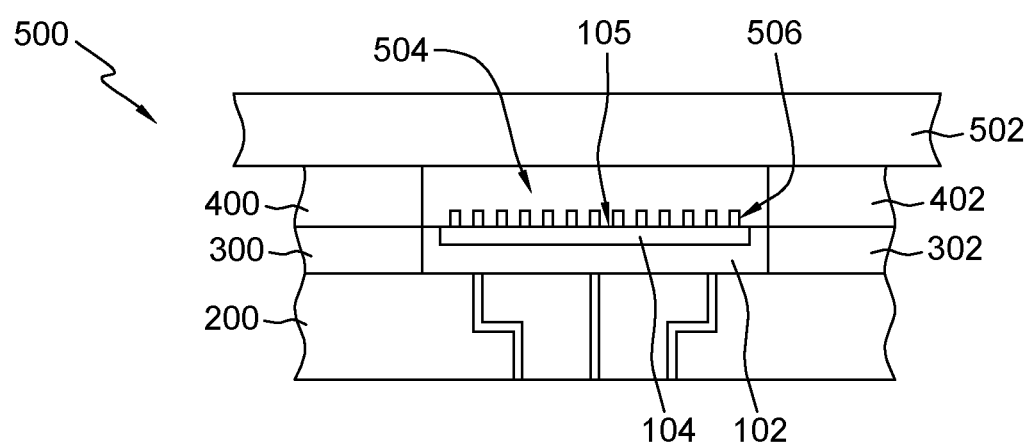

FIG. 5 is a cross-sectional view of one example of an end structure 500 (in this case, a flow cell) after placing lidding layer 502 on top column portions 400 and 402, in accordance with one or more aspects of the present disclosure. As used herein, the term "flow cell" refers to a small chamber with inlet(s) and outlet(s) for fluids under test on a substrate (e.g., glass), which may include channels that may be patterned with a multitude (there may be billions) of nanowells at fixed locations. The channels and nanowells on the substrate may be fabricated using, for example, semiconductor manufacturing technology, for example, the nanowells may be etched into the substrate. A sensor may be situated adjacent the chamber, for example, under the substrate, for localized sensing of various types of reactions, which may also be observable, with the fluids under test (e.g., fluorescence using an image sensor).

Continuing with FIG. 5, the placement of the lidding layer may be accomplished using, for example, relatively precise robotic machines (also known as pick-and-place machines), resulting in a space 504 over at least more than about half (in the example of FIG. 5 the space covers all or nearly all) of the active surface 105 of the sensor 104. The placement of the columns on opposite sides of the sensor, rather than the columns being on the active surface of the sensor may be referred to as a fan-out packaging process. The lidding layer may include materials that are unreactive with and transparent to incoming light or other waves that may trigger a sensing action from sensor 104. Non-limiting examples of materials of the lidding layer with low autofluorescence or being non-fluorescent include glass, for example, aluminosilicate glass or flat panel display glass (for example, "eagle" glass, available from Corning, Incorporated, Corning, N.Y.). The material having low or no autofluorescence ensures being able to view, for example, any fluorescent reaction in the flow cell. Substance(s), for example, biological or chemical substances(s), may be introduced into the space for on-chip sensing by the active surface of the sensor.

In one example, the active surface of the sensor has a uniform low roughness, i.e., the active surface is as smooth as possible. Optionally, multiple channels 506 for liquid(s) may be present in a secondary layer over the sensor in the space. The optional secondary layer may include, for example, glass as described above, on the sensor surface. Such a secondary layer may have a roughness about equal to that of the active surface of the sensor and a seamless interface with the active surface to enable fluidic exchange without entrainment or entrapment of the fluid(s).

Figure 6:
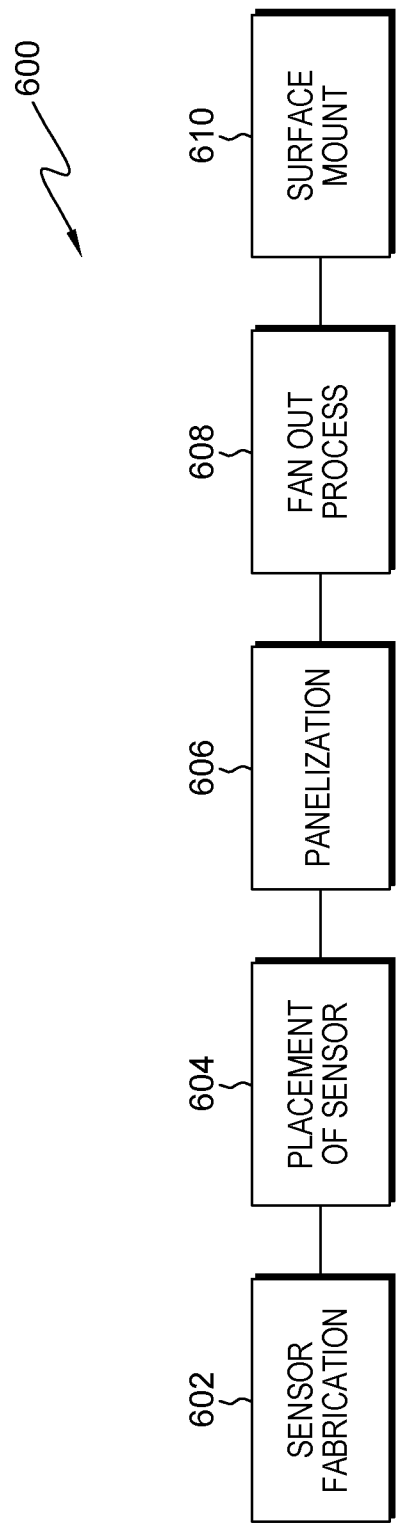
FIG. 6 is a flow diagram of one example of fabricating the apparatus disclosed herein, in accordance with one or more aspects of the present disclosure.

One example of a process 600 of fabricating the apparatus of the present disclosure will now be described with respect to the flow diagram of FIG. 6. Fabrication of one example of the sensor 602 is described above with respect to FIG. 1. Although that example relates to a CMOS image sensor, other types of active-pixel sensors may be used, for example, charge-coupled devices (CCDs) and other technologies, such as, for example, NMOS image sensor technology (also known as live MOS sensors) and image sensors with various color filters, e.g., microcolor splitters, which differ from the Bayer Color Filter Array (an array of tiny microfilters) in that they diffract light so that various combinations of wave lengths (colors) hit different photosites. A Live MOS Sensor offers image quality comparable to a Full Frame Transfer (FFT) CCD sensor with the low power needs of a CMOS sensor, and is noteworthy for its high-quality imaging capabilities over an extended period of time. Simplified circuitry that reduces the distance from each photodiode to its corresponding on-chip microlens (making for a denser, higher resolution sensor) assures excellent sensitivity and image quality even when light strikes it at a high angle of incidence. Alternatively, a preexisting or "off the shelf" sensor may be used instead of fabricating one.

Placement of the die and sensor 604 may include preparation, which may include, for example, lithographic and plating processes, and placement may be accomplished using, for example, precise robotic machines (also known as pick-and-place machines). Panelization 606 is then performed to join the sensor chip and the supporting layer. Panelization may include, for example, carrier lamination, attaching the sensor to a die, positioning the die on the supporting layer and fixing with a molding compound, planarization (or "top grind") of the molding compound and backside film lamination. Following panelization, a fan-out process 608 is performed to maximize use of the active surface of the sensor. In other words, forming the open space with the columns situated on opposite sides of the sensor, versus on the sensor, as described in more detail above, using, for example, lithography and plating processes, then a lidding layer may be placed on the columns using, for example, a surface mount process 610. In the surface mount process, the lidding layer is positioned on the columns using, for example, the precise robotic machines described above, and attached in some manner (e.g., using epoxy). Such machines may be used to place surface-mount devices onto a printed circuit board or similar. Such machines may use, for example, pneumatic suction cups manipulated in three dimensions to effect placement of the lidding layer.

Other ways to maximize use of the active surface of the sensor include, for example, designing and using a sensor with an active surface that is outside the area of the lid. Another example of increasing the useable area of the active surface of the sensor includes reconstituting the sensor into a lower-cost composite wafer, for example, plastic, using, for example, overmolding or gate molding processes.

In a first aspect, disclosed above is an apparatus. The apparatus includes a supporting structure, a sensor on the supporting structure, the sensor including an active surface. The apparatus further includes a pair of columns, each column situated on the supporting structure at opposite sides of the sensor, each of the pair of columns comprising a column height relative to a top surface of the supporting structure, the column height being higher than a height of the active surface of the sensor relative to the same top surface of the supporting structure, and a lidding layer on the pair of columns and over the active surface, the lidding layer being supported at opposite ends thereof by the pair of columns. The active surface of the sensor, the lidding layer and the pair of columns together form an opening above at least more than about half of the active surface of the sensor, and the supporting structure, the sensor, the lidding layer and the pair of columns together form a flow cell.

In one example, each of the pair of columns may include, for example, a bottom column portion at the opposite sides of the sensor, and a top column portion, which may be the same as or different than the material(s) of the bottom column portion, over the bottom column portion. In one example, the pair of columns may each include, for example, a filler material(s). The filler material(s) may include, for example, one of an epoxy and a plastic molding compound.

In one example, the lidding layer in the apparatus of the first aspect may include, for example, glass, e.g., at least one of aluminosilicate glass and flat panel display glass.

In one example, the supporting structure of the apparatus of the first aspect may include, for example, dielectric layer(s), and the dielectric layer(s) may include one or more conductive pathways therein.

In one example, the sensor in the apparatus of the first aspect may include, for example, one or more semiconductor materials, such as, for example, a sensor fabricated using CMOS technology (e.g., a CMOS image sensor, as described above).

In one example, a secondary layer on the active surface of the sensor in the apparatus of the first aspect may include, for example, channels.

In one example, the apparatus of the first aspect may, for example, be part of a cartridge for at least one of biological analysis and chemical analysis. Such a cartridge may be used to enable sequencing, for example, DNA sequencing, e.g., sequencing-by-synthesis or next-generation sequencing (also known as high-throughput sequencing). Such a cartridge may instead be used to enable genotyping, which involves determining differences in the genetic make-up (genotype) of an individual by examining the individual's DNA sequence using biological assays and comparing it to another individual's sequence or a reference sequence.

In a second aspect, disclosed above is a method. The method includes forming a flow cell, the forming including placing a sensor on a supporting structure, the sensor including an active surface, forming a pair of columns, each column at opposite sides of the sensor, each of the pair of columns comprising a column height relative to a top surface of the supporting structure, the column height being higher than a height of the active surface of the sensor relative to the top surface of the supporting structure, and placing a lidding layer on top surfaces of the pair of columns, such that the lidding layer and the pair of columns form a space above at least about half of the active surface of the sensor.

In one example, placing the sensor may include, for example, placing a sensor fabricated using CMOS technology (e.g., a CMOS image sensor, as described above).

In one example, forming the pair of columns in the method of the second aspect may include, for example, forming a bottom column portion at the opposite sides of the sensor, and forming a top column portion over each bottom column portion.

In one example, the supporting structure in the method of the second aspect may include, for example, dielectric layer(s), and the dielectric layer(s) may include conductive pathway(s) therein.

In one example, the method of the second aspect may further include, for example, coupling the flow cell and a cartridge for at least one of biological analysis and chemical analysis.

In one example, the method of the second aspect may further include, for example, using the flow cell for sequencing.

In one example, the method of the second aspect may further include, for example, using the flow cell for genotyping.

In one example, the pair of columns in the method of the second aspect may include, for example, filler material(s).

In one example, the filler material(s) in the method of the second aspect may include, for example, at least one of an epoxy and a plastic molding compound.

While several aspects of the present disclosure have been described and depicted herein, alternative aspects may be effected by those skilled in the art to accomplish the same objectives. Accordingly, it is intended by the appended claims to cover all such alternative aspects.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

The invention claimed is:
1. An apparatus, comprising:
a supporting structure;
a die;

a sensor on the die, the die and the sensor on the supporting structure, the sensor comprising an active surface;

a pair of columns, each column situated on the supporting structure at opposite sides of the die and the sensor and not on the sensor, each of the pair of columns comprising a column height relative to a top surface of the supporting structure, the column height being higher than a height of the active surface of the sensor relative to the top surface of the supporting structure; and a lidding layer on the pair of columns and over the active surface, the lidding layer being supported at opposite ends thereof by the pair of columns;

wherein the active surface of the sensor, the lidding layer and the pair of columns form an opening above at least more than about half of the active surface of the sensor, and wherein the supporting structure, the sensor, the lidding layer and the pair of columns together form a flow cell.

2. The apparatus of claim 1, wherein each of the pair of columns comprises:

a bottom column portion at the opposite sides of the sensor; and a top column portion over each bottom column portion.

3. The apparatus of claim 2, wherein the pair of columns comprises at least one filler material.

4. The apparatus of claim 3, wherein the at least one filler material comprises at least one of an epoxy and a plastic molding compound.

5. The apparatus of claim 1, wherein the lidding layer comprises glass.

6. The apparatus of claim 5, wherein the lidding layer comprises at least one of aluminosilicate glass and flat panel display glass.

7. The apparatus of claim 1, wherein the supporting structure comprises one or more dielectric layers, each of the one or more dielectric layers comprising one or more conductive pathways therein.

8. The apparatus of claim 1, wherein the sensor comprises one or more semiconductor materials.

9. The apparatus of claim 1, wherein the sensor comprises an image sensor fabricated using Complementary Metal-Oxide-Semiconductor (CMOS) technology.

10. The apparatus of claim 1, wherein a protective layer on the active surface of the sensor comprises a plurality of channels.

11. The apparatus of claim 1, wherein the apparatus is part of a cartridge for at least one of biological analysis and chemical analysis.

12. The apparatus of claim 1, wherein the supporting structure comprises one or more dielectric layers, each of the one or more dielectric layers comprising one or more conductive pathways, further comprising a chip comprising the die and the sensor, the chip on the supporting structure and positioned between the columns.

13. A method, comprising:

forming a flow cell, the forming comprising:

placing a die and a sensor on a supporting structure, the sensor on the die, the sensor comprising an active surface;

forming a pair of columns, each column at opposite sides of the die and the sensor and not on the sensor, each of the pair of columns comprising a column height relative to a top surface of the supporting structure, the column height being higher than a height of the active surface of the sensor relative to the top surface of the supporting structure; and placing a lidding layer on top surfaces of the pair of columns, such that the lidding layer and the pair of columns form a space above at least about half of the active surface of the sensor.

14. The method of claim 13, wherein placing the sensor comprises placing an image sensor fabricated using CMOS technology.

15. The method of claim 13, wherein forming the pair of columns comprises:

forming a bottom column portion at the opposite sides of the sensor; and forming a top column portion over each bottom column portion.

16. The method of claim 13, wherein the supporting structure comprises one or more dielectric layers, the one or more dielectric layers each comprising one or more conductive pathways therein.

17. The method of claim 13, the method further comprising coupling the flow cell and a cartridge for at least one of biological analysis and chemical analysis.

18. The method of claim 13, the method further comprising using the flow cell for sequencing.

19. The method of claim 13, the method further comprising using the flow cell for genotyping.

20. The method of claim 13, wherein the pair of columns comprises at least one filler material.

21. The method of claim 20, wherein the at least one filler material comprises at least one of an epoxy and a plastic molding compound.

* * * * *